United States Patent
Hong et al.

(10) Patent No.: US 7,957,190 B2
(45) Date of Patent: Jun. 7, 2011

(54) MEMORY HAVING P-TYPE SPLIT GATE MEMORY CELLS AND METHOD OF OPERATION

(75) Inventors: Cheong M. Hong, Austin, TX (US); Sung-Taeg Kang, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 398 days.

(21) Appl. No.: 12/130,197

(22) Filed: May 30, 2008

(65) Prior Publication Data
US 2009/0296491 A1 Dec. 3, 2009

(51) Int. Cl.
*G11C 16/04* (2006.01)
(52) U.S. Cl. ......... 365/185.11; 365/185.12; 365/185.28; 365/185.29
(58) Field of Classification Search ............. 365/185.11, 365/185.29, 185.12, 185.28
See application file for complete search history.

(56) References Cited

U.S. PATENT DOCUMENTS

| | | | |
|---|---|---|---|
| 5,812,452 A * | 9/1998 | Hoang | 365/185.11 |
| 6,573,555 B1 | 6/2003 | Lin et al. | |
| 6,697,281 B2 * | 2/2004 | Hoang | 365/185.17 |
| 6,816,414 B1 | 11/2004 | Prinz | |
| 6,920,067 B2 | 7/2005 | Hsu et al. | |
| 6,922,363 B2 | 7/2005 | Hsu et al. | |
| 7,259,984 B2 * | 8/2007 | Kan et al. | 365/177 |
| 7,692,972 B1 * | 4/2010 | Sadd et al. | 365/185.26 |
| 2008/0188052 A1 * | 8/2008 | Winstead et al. | 438/299 |

FOREIGN PATENT DOCUMENTS
WO 2005013281 A2 2/2005

OTHER PUBLICATIONS

Lee et al; "NeoFlash—True Logic Single Poly Flash Memory Technology"; 2006 Non-Volatile Semiconductor Memory Workshop, IEEE, pp. 15-16.

* cited by examiner

*Primary Examiner* — Pho M Luu
(74) *Attorney, Agent, or Firm* — Daniel D. Hill

(57) ABSTRACT

A memory comprising a plurality of P-channel split-gate memory cells are organized in rows and columns. Each of the plurality of P-channel split-gate memory cells comprises a select gate, a control gate, a source region, a drain region, a channel region, and a charge storage layer comprising nanocrystals. Programming a memory cell of the plurality of P-channel split-gate memory cells comprises injecting electrons from a channel region of the memory cell to the charge storage layer. Erasing the memory cell comprises injecting holes from the channel region to the charge storage region.

20 Claims, 2 Drawing Sheets

PROGRAM – HCI SECONDARY ELECTRON

ERASE – SSI OF HOLES

US 7,957,190 B2

MEMORY HAVING P-TYPE SPLIT GATE MEMORY CELLS AND METHOD OF OPERATION

BACKGROUND

1. Field

This disclosure relates generally to semiconductor memories, and more specifically, to a flash memory having P-type split gate memory cells and method of operation.

2. Related Art

There are various types of non-volatile memories. One type of flash memory uses a split-gate memory cell having a floating gate for charge storage, a select gate, and a control gate. The split-gate memory cell is also commonly known as a 1.5 T cell. In the split-gate memory cell, the select gate and the control gate may be separated by only a few hundred angstroms, making the split-gate cell substantially smaller than a 2 T cell that generally has wider spacing between the select gate and control gate. A split-gate memory cell can be categorized as having either an N-type or P-type channel region. The P-channel split-gate memory cell has certain disadvantages when compared to an N-channel cell. For example, a program window between erased and programmed voltages may be relatively small. Also, operating voltages of the P-channel cell may be relatively high. In addition, erase times may be relatively long compared to an N-channel split-gate cell. However, it may be desirable to use P-channel split-gate cells in some integrated circuit designs.

Therefore, what is needed is a P-channel split-gate memory cell that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
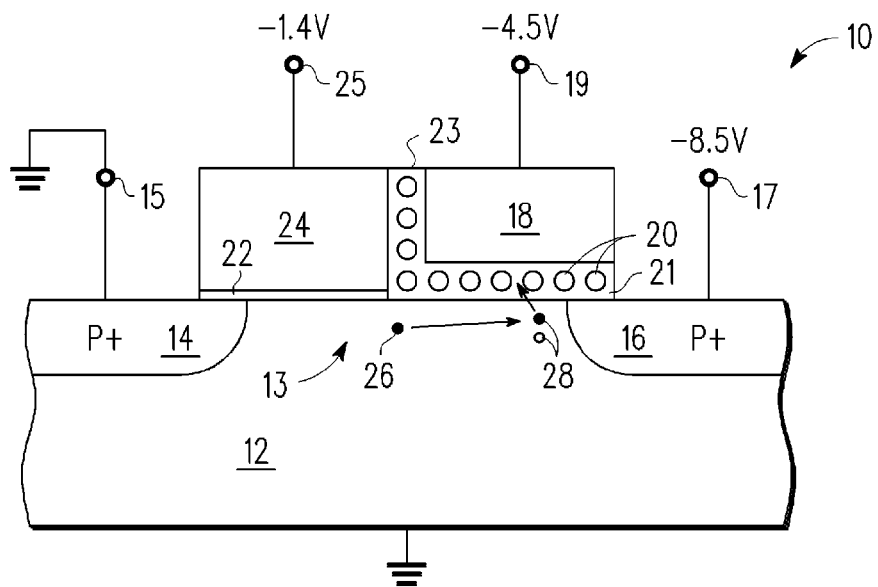
FIG. 1 illustrates a simplified cross-sectional view of a split-gate memory cell during a program operation in accordance with an embodiment.

Generally, there is provided, a P-channel split-gate memory cell that uses hot carrier injection (HCI) secondary electron for programming operations (increasing a threshold voltage (VT) of the memory cell), and uses source-side injection (SSI) of holes for erasing operations (decreasing the VT of the memory cell). In one embodiment, the P-channel split-gate memory cell has a charge storage layer comprising nanocrystals. The P-channel split-gate memory cell in accordance with the described embodiments provides for a larger programming window, lower operating voltages, and faster erase operations than a comparable N-channel split-gate memory cell.

In one aspect, there is provided, a method for operating a memory. The memory comprises a plurality of P-channel split-gate memory cells organized in rows and columns. Each of the plurality of P-channel split-gate memory cells comprises a select gate, a control gate, a source region, a drain region, a channel region, and a charge storage region comprising nanocrystals. The method comprises programming a memory cell of the plurality of P-channel split-gate memory cells by injecting electrons from a channel region of the memory cell to the charge storage region; and erasing the memory cell by injecting holes from the channel region to the charge storage region. Programming the memory cell may further comprise: applying a first voltage to the select gate; applying a second voltage to the control gate, the second voltage having a lower potential than the first voltage; and applying a third voltage to the source region, the third voltage having a lower potential than either of the first and second voltages, wherein the first, second, and third voltages are applied at a same time. Also, programming the memory cell may further comprise coupling the drain region to ground. Erasing the memory cell may further comprise: applying a first voltage to the select gate; applying a second voltage to the control gate, the second voltage having a lower potential than the first voltage; and applying a third voltage to the source region, the third voltage having a lower potential than the first voltage and a higher potential than the second voltage, wherein the first, second, and third voltages are applied at a same time. Programming the memory cell may further comprise biasing the control gate of the memory cell with a first voltage and biasing the select gate of the memory cell with a second voltage, the second voltage being different than the first voltage. At least some of the nanocrystals may have a diameter in a range of 60 to 100 Angstroms. Injecting electrons from a channel region of the memory cell to the charge storage region may further comprise programming using HCI secondary electron. Erasing may further comprise using source-side injection of holes.

In another aspect, there is provided, a method for operating a memory. The memory comprises a plurality of P-channel split-gate memory cells organized in rows and columns. Each of the plurality of P-channel split-gate memory cells comprises a select gate, a control gate, a source region, a drain region, a channel region, and a charge storage region comprising nanocrystals. The method comprises: programming a memory cell of the plurality of P-channel split-gate memory cells using hot carrier injection (HCI) secondary electron; and erasing the memory cell using source-side injection (SSI) of holes. Programming the memory cell may further comprise: applying a first voltage to the select gate, the first voltage in a range of negative 1 to negative 2 volts; applying a second voltage to the control gate, the second voltage in a range of negative 4 to negative 6 volts; and applying a third voltage to the source region, the third voltage in a range of negative 7 to negative 10 volts, wherein the first, second, and third voltages are applied at a same time. Programming the memory cell may further comprise coupling the drain region to ground. Erasing the memory cell may further comprise: applying a first voltage to the select gate, the first voltage in a range of negative 1 to negative 2 volts; applying a second voltage to the control gate, the second voltage in a range of negative 9 to negative 13 volts; and applying a third voltage to the source region, the third voltage in a range of negative 4 to negative 7 volts, wherein the first, second, and third voltages are applied at a same time. Programming the memory cell may further comprise biasing the control gate of the memory cell with a first voltage and biasing the select gate of the memory cell with a second voltage, the second voltage being different than the first voltage. At least some of the nanocrystals may have a diameter in a range of 60 to 100 Angstroms.

In yet another aspect, there is provided, a memory comprising: a memory array comprising a plurality of P-channel split-gate memory cells organized in rows and columns. Each of the plurality of P-channel split-gate memory cells comprises a charge storage region comprising nanocrystals, a select gate, a control gate, a source region, a drain region, and a channel region. The control gates of all of the plurality of P-channel split-gate memory cells are coupled together, and the source regions of all of the plurality of P-channel split-gate memory cells are coupled together. A word line of a plurality of word lines is coupled to the select gate of each P-channel split-gate memory cell of a row of the P-channel split-gate memory cells. A bit line of the plurality of bit lines is coupled to the drain region of each P-channel split-gate memory cell of a column of the plurality of P-channel split-gate memory cells. A control circuit is provided for controlling a programming operation and an erasing operation of the plurality of P-channel memory cells. The programming operation is performed by injecting electrons from the channel region to the charge storage region of a selected memory cell, and the erasing operation is performed by injecting holes from the channel region to the charge storage region of a selected memory cell. The programming operation may be performed using hot carrier injection (HCI) secondary electron, and the erasing operation may be performed using source-side injection (SSI) of holes. A diameter of at least some of the nanocrystals may be in a range between 60 and 100 Angstroms. The select gate and control gate may be formed from polysilicon. The polysilicon of the select gate may be doped with P-type impurities. The select gate, control gate, and drain region may receive negative voltages during the programming and erasing operations.

FIG. 1 illustrates a simplified cross-sectional view of a P-channel split-gate memory cell 10 during a program operation in accordance with an embodiment. P-channel split-gate memory cell 10 is formed on a semiconductor substrate 12. A P+ drain diffusion region 14 and a P+ source diffusion region 16 are formed in substrate 12. A channel region 13 can be formed between the drain region 14 and the source region 16 in response to certain voltage potentials applied to the select gate 25 and the control gate 19. A charge storage layer 23 comprises nanocrystals 20 embedded within a dielectric 21 and formed over substrate 12. Charge storage layer 23 is formed between control gate 18 and substrate 12, continuing on a side of control gate 18. Dielectric 21 may comprise multiple dielectric layers. For example, a bottom dielectric layer, between substrate 12 and nanocrystals 20, may be formed by growing between about 50 to 70 Angstroms of a relatively high quality oxide on substrate 12. Relatively large nanocrystals 20 are then formed on the bottom dielectric layer that are between about 60 and 100 Angstroms in diameter. A top dielectric layer comprising HTO (high temperature oxide) may then be deposited on the bottom dielectric layer and on nanocrystals 20 to a thickness of about 120 to 150 Angstroms. A gate dielectric 22 and select gate 24 are formed over substrate 12 adjacent on one side of control gate 18 with charge storage layer 23 between control gate 18 and select gate 24. Select gate 24 and control gate 18 may be formed from polysilicon. Additionally, select gate 24 may be polysilicon doped with P-type impurities. Gate dielectric 22 may be a grown low voltage (LV) oxide having a thickness of about 20 Angstroms. In another embodiment, gate dielectric 22 may be a dual gate oxide having a thickness of about 50 to 70 Angstroms. A terminal, or contact, 15 provides an electrical connection to drain region 14. Likewise, terminal 17 provides an electrical connection to source region 16, terminal 19 provides an electrical connection to control gate 19, and terminal 25 provides an electrical connection to select gate 24. Terminals 15, 17, 19, and 25 may be formed from a metal or from another type of conductive material such as polysilicon.

In one embodiment, substrate 12 and nanocrystals 20 are formed from silicon. Also, in another embodiment, substrate 12 may be an N-well formed in a silicon substrate. The various layers and doped regions of example memory cell 10 may be formed using conventional semiconductor processing techniques.

A program operation of memory cell 10 causes electrons to be transferred from the channel region to nanocrystals 20. In the illustrated embodiment, electrons are transferred using hot carrier injection (HCI) secondary electron. As can be seen in FIG. 1, HCI secondary electron causes primary electrons, represented by electron 26, to be injected from channel region 13. Impact ionization generates electron/hole pairs, such as electron/hole pair 28, causing some electrons to be injected into charge storage layer 23 and thus provide charge to nanocrystals 20. Charging nanocrystals 20 with electrons causes the threshold voltage (VT) of P-channel split-gate memory cell 10 to increase so that a read operation of memory cell 10 will output a logic "0" onto a corresponding bit line.

As an example of an HCI secondary electron programming operation, specific voltages are provided in FIG. 1. For the memory cell illustrated in FIG. 1 and described above, select gate terminal 25 receives about −1.4 volts, control gate terminal 19 receives about −4.5 volts, drain region terminal 17 receives −8.5 volts, and source region terminal 15 is coupled to ground. Note also that substrate 12 is grounded. Alternately, a select gate voltage may be in a range of −1 to −2 volts, a control gate voltage may be in a range of −4 to −6 volts, a source region voltage may be in a range of −7 to −10 volts. In other embodiments, programming using HCI secondary electron can be performed using different bias voltages depending on factors such as cell design, materials, and layer thicknesses. HCI secondary electron provides a higher current programming operation than, for example, Fowler-Nordheim tunneling and can therefore be performed faster and more efficiently while using reasonably low voltages.

Figure 2:
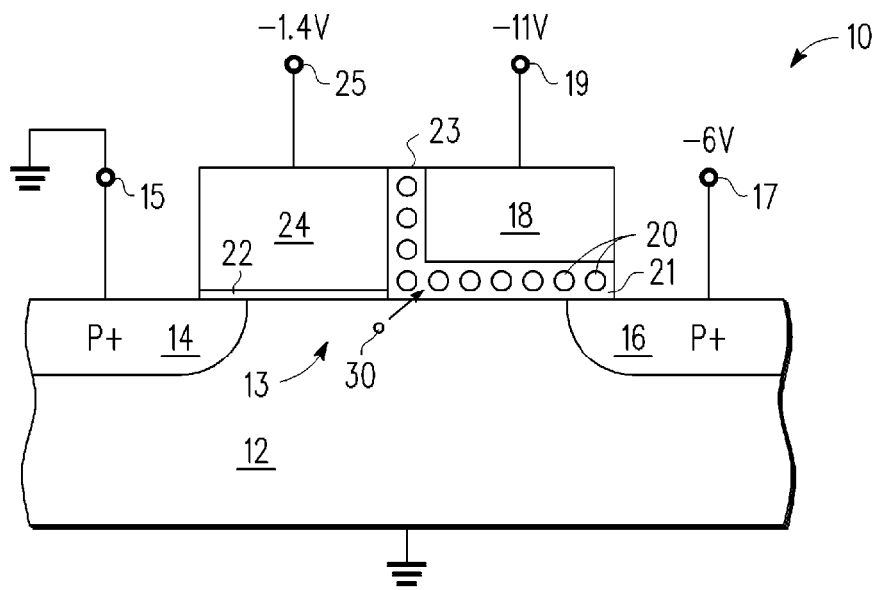
FIG. 2 illustrates the memory cell of FIG. 1 during an erase operation.

FIG. 2 illustrates memory cell 10 during an erase operation. An erase operation removes electrons from nanocrystals to lower the VT of the memory cell. The lowered VT allows the memory cell to be made conductive with lower select and control gate voltages so an erased memory cell will read as a logic "1". In accordance with one embodiment, charge is removed from nanocrystals 20 by injecting holes from channel region 13 to charge storage layer 23 using source-side injection (SSI) of holes. (A representative hole 30 being injected is illustrated in FIG. 2.)

An example of specific voltages for erasing memory 10 using SSI of holes is illustrated in FIG. 2. For the memory cell illustrated in FIG. 1 and described above, select gate terminal 25 receives about −1.4 volts, control gate terminal 19 receives about −11 volts, drain region terminal 17 receives −6 volts, and source region terminal 15 is coupled to ground. Note also that substrate 12 is grounded in the illustrated embodiment. Alternately, a select gate voltage may be in a range of −1 to −2 volts, a control gate voltage may be in a range of −9 to −13 volts, a source region voltage may be in a range of −4 to −7 volts. In other embodiments, erasing using SSI of holes can be performed using different bias voltages depending on factors such as cell design, materials, and layer thicknesses.

The illustrated embodiments provide several advantages. For example, erasing memory cell 10 by injecting holes is faster than erasing a memory cell using Fowler-Nordheim tunneling. Programming with HCI secondary electrons injects more charge, thus providing a larger programming window. A program window is a voltage difference between an erased state and a programmed state. The program window and programming speed increase as a gate length decreases.

Experiments conducted by the applicants of the present disclosure have shown that using HCI secondary electron for programming operations and SSI of holes for erasing operations provides a program window for a P-channel split-gate memory cell that is larger than a program window of an N-channel split-gate memory cell for the same gate length. In addition, negative voltages are used for both programming and erasing operations, potentially reducing the number of voltage sources needed for the memory.

Figure 3:
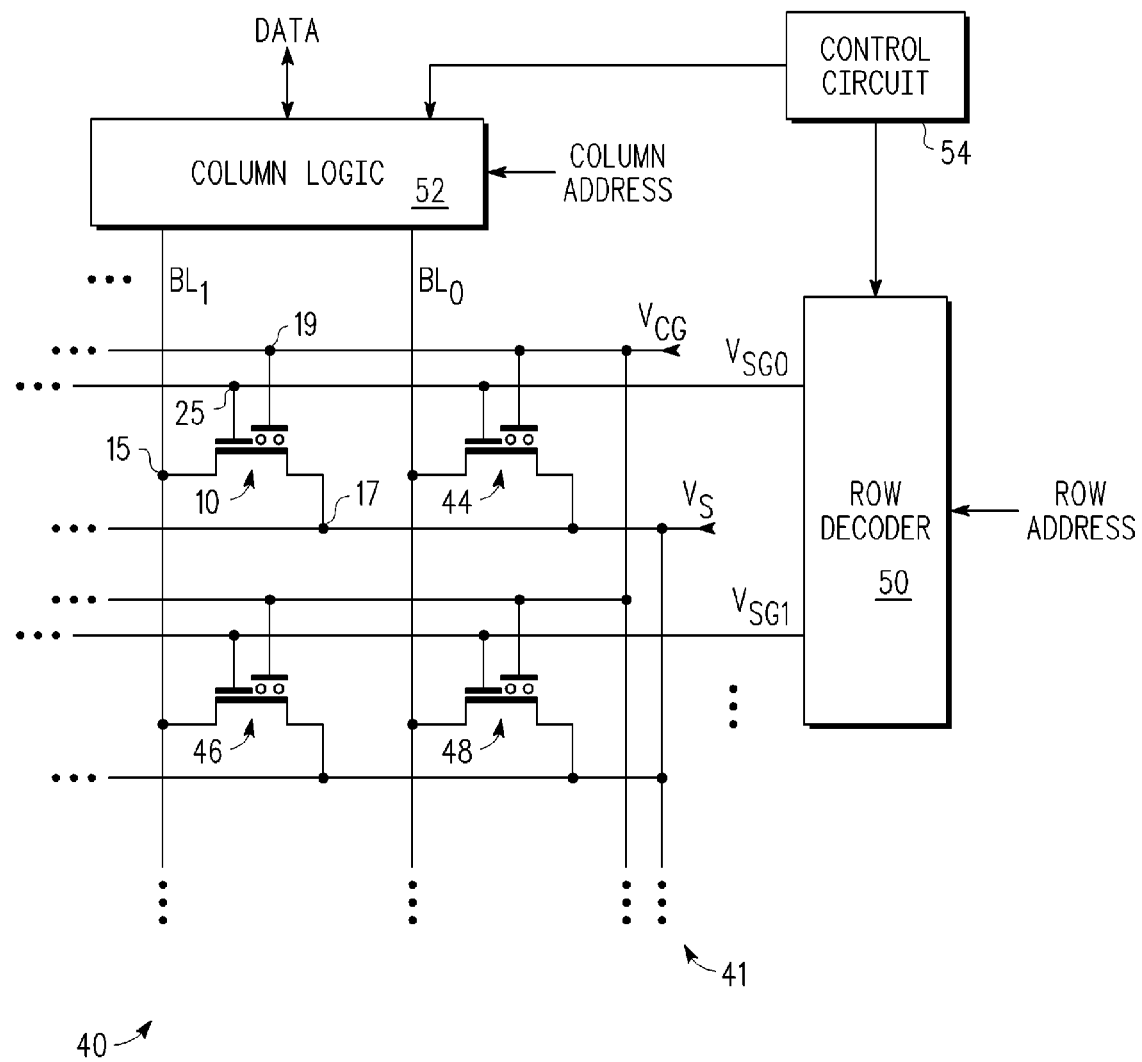
FIG. 3 illustrates, in partial block diagram form and partial schematic diagram form, a memory having the memory cell of FIG. 1 and FIG. 2.

FIG. 3 illustrates, in partial block diagram form and partial schematic diagram form, a memory 40 having an array of P-channel split-gate memory cells similar to memory cell 10. Memory 40 includes memory array 41, row decoder 50, column logic 52, and control circuit 54.

Memory array 41 includes a plurality of P-channel split-gate memory cells such as memory cells 10, 44, 46, and 48. (Only four memory cells are shown for the purposes of simplicity and clarity.) Memory array 41 is organized in row and columns. A row of memory cells includes a word line and all of the memory cells coupled to the word line. A column of memory cells includes a bit line and all of the memory cells coupled to the bit line. The source regions of each of the memory cells are coupled together to receive a source voltage labeled "VS". For example, source terminal 17 of memory cell 10 and the source terminals of memory cells 44, 46, and 48 are coupled to receive source voltage VS. The control gates of each of the memory cells are coupled together to receive a control gate voltage labeled "VCG". As illustrated, control gate terminal 19 of memory cell 10, and the control gates of memory cells 44, 46, and 48 are coupled to receive control gate voltage VCG.

Row decoder 50 has an input for receiving a row address labeled "ROW ADDRESS", and a plurality of output terminals coupled to word lines. Each of the word lines is coupled to the select gates of a row of memory cells. For example, a word line labeled "VSG0" is coupled to select gate terminal 25 of memory cell 10 and the select gate of memory cell 44. A word line labeled "VSG1" is coupled to the select gates of memory cells 46 and 48. When a memory cell is to be accessed for read, program, and erase operations, a voltage will be provided to one or more of the word lines in response to a row address.

Column decoder 52 as an input for receiving a column address labeled "COLUMN ADDRESS", and a plurality of bidirectional terminals labeled "DATA". Column logic 52 includes column decoder circuits, sense amplifiers, input/output buffers, and other circuits necessary to input and output data signals DATA to the bit lines, such as bit lines "BL1" and "BL0" in response to a column address. Bit line BL1 is coupled to drain terminal 15 of memory cell 10 and to the drain terminal of memory cell 46. Likewise, bit line BL0 is coupled to the drain terminals of memory cells 44 and 48.

Control circuit 54 is coupled to column logic 52 and to row decoder 50 and controls the application of read, program, and erase voltages of memory array 41. For example, during a programming operation of memory cell 10, as described above in the discussion of FIG. 1, control circuit 54 causes bit line BL1 to be coupled to ground, the word line VSG0 to provide a negative 1.4 volts to select gate terminal 25, the voltage source of VCG to provide a negative 4.5 volts to the control gates of array 41, and the voltage source of VS to provide a negative 8.5 volts to each source terminal of array 41. In accordance with one embodiment, memory 40 is a flash memory, so control circuit 54 will provide the erase voltages illustrated in FIG. 2 to all of the memory cells of memory array 41 simultaneously. In another embodiment, memory array 41 may erase cells individually or in blocks of cells.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the semiconductor substrate described herein can be any semiconductor material or combinations of materials, such as gallium arsenide, silicon germanium, silicon-on-insulator (SOI), silicon, monocrystalline silicon, the like, and combinations of the above. Also, a second control gate can be added to provide a memory cell having multiple charge storage regions. In addition, the memory array may be organized as blocks of memory cells, where an erase operation erases only the memory cells of a particular block.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. In a memory comprising a plurality of P-channel split-gate memory cells organized in rows and columns, each of the plurality of P-channel split-gate memory cells comprising a select gate, a control gate, a source region, a drain region, a channel region, and a charge storage layer comprising nanocrystals, a method comprising:

programming a memory cell of the plurality of P-channel split-gate memory cells by injecting electrons from a channel region of the memory cell to the charge storage region; and erasing the memory cell by injecting holes from the channel region to the charge storage region.

2. The method of claim 1, wherein programming the memory cell further comprises:
applying a first voltage to the select gate;
applying a second voltage to the control gate, the second voltage having a lower potential than the first voltage; and
applying a third voltage to the source region, the third voltage having a lower potential than either of the first and second voltages, wherein the first, second, and third voltages are applied at a same time.

3. The method of claim 2, wherein programming the memory cell further comprises coupling the drain region to ground.

4. The method of claim 1, wherein erasing the memory cell further comprises:
applying a first voltage to the select gate;
applying a second voltage to the control gate, the second voltage having a lower potential than the first voltage; and
applying a third voltage to the source region, the third voltage having a lower potential than the first voltage and a higher potential than the second voltage, wherein the first, second, and third voltages are applied at a same time.

5. The method of claim 1, wherein programming the memory cell further comprises biasing the control gate of the memory cell with a first voltage and biasing the select gate of the memory cell with a second voltage, the second voltage being different than the first voltage.

6. The method of claim 1, wherein at least some of the nanocrystals have a diameter in a range of 60 to 100 Angstroms.

7. The method of claim 1, wherein programming a memory cell by injecting electrons from a channel region of the memory cell to the charge storage layer further comprises programming using HCI secondary electron.

8. The method of claim 1, wherein erasing the memory cell by injecting holes from the channel region to the charge storage layer further comprises erasing using source-side injection of holes.

9. In a memory comprising a plurality of P-channel split-gate memory cells organized in rows and columns, each of the plurality of P-channel split-gate memory cells comprising a select gate, a control gate, a source region, a drain region, a channel region, and a charge storage layer comprising nanocrystals, the method comprising:
programming a memory cell of the plurality of P-channel split-gate memory cells using hot carrier injection (HCI) secondary electron; and
erasing the memory cell using source-side injection (SSI) of holes.

10. The method of claim 9, wherein programming the memory cell further comprises:
applying a first voltage to the select gate, the first voltage in a range of negative 1 to negative 2 volts;
applying a second voltage to the control gate, the second voltage in a range of negative 4 to negative 6 volts; and
applying a third voltage to the source region, the third voltage in a range of negative 7 to negative 10 volts, wherein the first, second, and third voltages are applied at a same time.

11. The method of claim 10, wherein programming the memory cell further comprises coupling the drain region to ground.

12. The method of claim 9, wherein erasing the memory cell further comprises:
applying a first voltage to the select gate, the first voltage in a range of negative 1 to negative 2 volts;
applying a second voltage to the control gate, the second voltage in a range of negative 9 to negative 13 volts; and
applying a third voltage to the source region, the third voltage in a range of negative 4 to negative 7 volts, wherein the first, second, and third voltages are applied at a same time.

13. The method of claim 9, wherein programming the memory cell further comprises biasing the control gate of the memory cell with a first voltage and biasing the select gate of the memory cell with a second voltage, the second voltage being different than the first voltage.

14. The method of claim 9, wherein at least some of nanocrystals have a diameter in a range of 60 to 100 Angstroms.

15. A memory comprising:
a memory array comprising a plurality of P-channel split-gate memory cells organized in rows and columns, each of the plurality of P-channel split-gate memory cells comprising a charge storage layer comprising nanocrystals, a select gate, a control gate, a source region, a drain region, and a channel region, wherein the control gates of all of the plurality of P-channel split-gate memory cells are coupled together, and wherein the source regions of all of the plurality of P-channel split-gate memory cells are coupled together;
a plurality of word lines, a word line of the plurality of word lines coupled to the select gate of each P-channel split-gate memory cell of a row of the P-channel split-gate memory cells;
a plurality of bit lines, a bit line of the plurality of bit lines coupled to the drain region of each P-channel split-gate memory cell of a column of the plurality of P-channel split-gate memory cells; and
a control circuit for controlling a programming operation and an erasing operation of the plurality of P-channel memory cells, wherein the programming operation is performed by injecting electrons from the channel region to the charge storage layer of a selected memory cell, and the erasing operation is performed by injecting holes from the channel region to the charge storage layer of a selected memory cell.

16. The memory of claim 15, wherein the programming operation is performed using hot carrier injection (HCI) secondary electron, and the erasing operation is performed using source-side injection (SSI) of holes.

17. The memory of claim 15, wherein a diameter of at least some of the nanocrystals is in a range between 60 and 100 Angstroms.

18. The memory of claim 15, wherein the select gate and control gate are formed from polysilicon.

19. The memory of claim 18, wherein the polysilicon of the select gate is doped with P-type impurities.

20. The memory of claim 15, wherein the select gate, control gate, and drain region are for receiving negative voltages during the programming and erasing operations.

* * * * *